US 6,661,815 B1

(12) United States Patent
Kozlovsky et al.

(10) Patent No.: US 6,661,815 B1
(45) Date of Patent: Dec. 9, 2003

(54) SERVO TECHNIQUE FOR CONCURRENT WAVELENGTH LOCKING AND STIMULATED BRILLOUIN SCATTERING SUPPRESSION

(75) Inventors: William J. Kozlovsky, Sunnyvale, CA (US); Andrew Daiber, Emerald Hills, CA (US); Doug Sprock, San Jose, CA (US); Mark S. Rice, San Jose, CA (US); Jiann-Chang Lo, Cupertino, CA (US); Rob Carney, Belmont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,684

(22) Filed: Dec. 31, 2002

(51) Int. Cl.⁷ ................................................ H01S 3/13
(52) U.S. Cl. .................. 372/20; 372/38.08; 372/32; 372/29.011; 372/28; 372/26; 372/31; 372/92
(58) Field of Search .................. 372/20, 32, 38.88, 372/29.011, 31, 28, 26, 92

(56) References Cited

U.S. PATENT DOCUMENTS

| | | | | |
|---|---|---|---|---|
| 5,329,396 A | * | 7/1994 | Fishman et al. ............. | 398/147 |
| 5,420,868 A | * | 5/1995 | Chraplyvy et al. .......... | 398/185 |
| 5,430,569 A | * | 7/1995 | Blauvelt et al. ............. | 398/199 |
| 5,473,625 A | * | 12/1995 | Hansen et al. ................ | 372/96 |
| 5,477,368 A | * | 12/1995 | Eskildsen et al. ............ | 398/147 |
| 5,566,381 A | * | 10/1996 | Korotky ....................... | 398/147 |
| 5,592,282 A | * | 1/1997 | Hartog .......................... | 356/44 |
| 5,737,109 A | * | 4/1998 | Goodwin ...................... | 398/197 |
| 5,991,061 A | * | 11/1999 | Adams et al. ................ | 398/182 |
| 6,166,837 A | * | 12/2000 | Adams et al. ................ | 398/200 |
| 6,252,693 B1 | * | 6/2001 | Blauvelt ....................... | 398/194 |
| 6,396,586 B1 | * | 5/2002 | Wei et al. ..................... | 356/479 |
| 6,414,772 B2 | * | 7/2002 | Miyazaki ...................... | 398/91 |
| 6,515,113 B2 | * | 2/2003 | Raymond et al. ............. | 534/15 |
| 6,535,315 B1 | * | 3/2003 | Way et al. .................... | 398/182 |
| 6,542,683 B1 | * | 4/2003 | Evans et al. ................. | 385/127 |
| 6,580,532 B1 | * | 6/2003 | Yao et al. ..................... | 398/39 |
| 2001/0010587 A1 | * | 8/2001 | Miyazaki ...................... | 359/161 |
| 2001/0030796 A1 | * | 10/2001 | Yao ............................... | 359/334 |
| 2003/0067952 A1 | * | 4/2003 | Tsukiji et al. .................. | 372/36 |
| 2003/0086174 A1 | * | 5/2003 | Wakisaka et al. ............ | 359/566 |
| 2003/0133482 A1 | * | 7/2003 | Yoshida et al. ................ | 372/43 |
| 2003/0142700 A1 | * | 7/2003 | Pontis et al. .................. | 372/20 |
| 2003/0142701 A1 | * | 7/2003 | Pontis et al. .................. | 372/20 |

\* cited by examiner

*Primary Examiner*—Leon Scott, Jr.
(74) *Attorney, Agent, or Firm*—Blakely, Sokoloff, Taylor & Zafman LLP

(57) ABSTRACT

A servo technique for concurrently providing wavelength locking and stimulated Brillouin scattering (SBS) suppression in an external cavity laser. Respective wavelength locking and SBS suppression signals are generated by a controller and combined into a composite drive signal. The composite drive signal is used to drive an optical path length adjustment element to modulate the optical path length of the laser cavity. The wavelength locking and SBS suppression portions of the drive signals produce concurrent modulations of the laser optical path length having different modulation frequencies and causing different frequency (wavelength) excursions. These modulations produce corresponding wavelength and intensity amplitude modulations in the laser's output. A feedback signal indicative of the intensity amplitude modulations is filtered to attenuate the portion of the signal due to the SBS suppression modulation, and is received as a tuning feedback signal by the controller. In response, the control provides a tuning adjustment signal to adjust the frequency of the laser.

29 Claims, 7 Drawing Sheets

100

SERVO TECHNIQUE FOR CONCURRENT WAVELENGTH LOCKING AND STIMULATED BRILLOUIN SCATTERING SUPPRESSION

FIELD OF THE INVENTION

The field of invention relates generally to optical communications and, more specifically but not exclusively relates to a servo technique for controlling the cavity length of an external cavity diode laser (ECDL) so as to concurrently perform wavelength locking and suppression of stimulated Brillouin scattering.

BACKGROUND INFORMATION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser-tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths.

Typically, optical signals are transmitted over a fiber optic based infrastructure. One problem that may occur when laser-based optical sources transmit optical signals over fiber relates to Brillouin scattering. Brillouin scattering is an inelastic process in which part of the power is lost from an optical wave and absorbed by the transmission medium. The remaining energy is then re-emitted as a wave of lower frequency. Brillouin scattering processes can become nonlinear in optical fibers due to the high optical intensity in the core and the long interaction lengths afforded by these waveguides. Stimulated Brillouin scattering (SBS) occur when the light launched into the fiber exceeds a threshold power level for the process. Under the conditions of stimulated scattering, optical power is more efficiently converted from the input pump wave to a scattered Stokes wave.

The scattered wave is frequency-shifted from the pump and in the case of SBS propagates in the opposite direction. This means that the amount of optical power leaving the far end of the fiber no longer increases linearly with the input power. The maximum launch power becomes clamped and the excess is simply reflected back out of the fiber. For long distance or highly-branched fiber links, it is important that as much power as possible can be launched into the fiber to compensate for attenuation and power splitting. Limits on the maximum output power due to SBS should therefore be avoided.

The foregoing stimulated Brillouin scattering problem is addressed in DBF lasers by using current control. However, this approach does not work for external cavity lasers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION OF PREFERRED EMBODIMENTS

Embodiments of a servo technique and apparatus for concurrently performing wavelength locking and SBS suppression in an external cavity diode laser (ECDL) are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
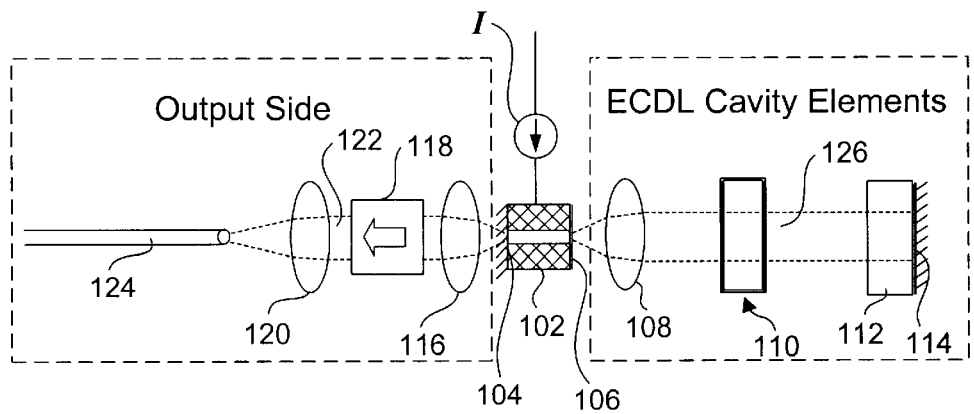
FIG. 1 is a schematic diagram of a generalized embodiment of an external cavity diode laser (ECDL)

As an overview, a generalized embodiment of an ECDL 100 that may be used to implement aspects of the invention described below is shown in FIG. 1. ECDL 100 includes a gain medium comprising a diode gain chip 102. Diode gain chip 102 comprises a Fabry-Perot diode laser including a partially-reflective front facet 104 and a substantially non-reflective rear facet 106 coated with an anti-reflective (AR) coating to minimize reflections at its face. Optionally, diode gain chip 102 may comprise a bent-waveguide structure on the gain medium to realize the non-reflective rear facet 106. The external cavity elements include a diode intracavity collimating lens 108, tuning filter elements 110, a cavity-length modulating element 112, and a reflective element 114. In general, reflective element 114 may comprise a mirror, grating, prism, or other reflector or retroreflector which may also provide the tuning filter function in place of element 110. The output side components include a diode output collimating lens 116, an optical isolator 118, and a fiber focusing lens 120, which focuses an output optical beam 122 such that it is launched into an output fiber 124.

The basic operation of ECDL 100 is a follows. A controllable current I is supplied to diode gain chip 102 (the gain medium), resulting in a voltage differential across the diode junction, which produces an emission of optical energy (photons). The emitted photons pass back and forth between partially-reflective front facet 104 and reflective element 114, which collectively define the ends of the laser cavity. As the photons pass back and forth, a plurality of resonances, or "lasing" modes are produced. Under a lasing mode, a portion of the optical energy (photons) temporarily occupies the external laser cavity, as depicted by intracavity optical beam 126; at the same time, a portion of the photons in the external laser cavity eventually passes through partially-reflective front facet 104.

Light comprising the photons that exit the laser cavity through partially-reflective front facet 104 passes through diode output collimating lens 116, which collimates the light into output beam 122. The output beam then passes through optical isolator 118. The optical isolator is employed to prevent back-reflected light from being passed back into the external laser cavity, and is generally an optional element. After the light beam passes through the optical isolator, it is launched into the output fiber 124 by fiber focusing lens 120. Generally output fiber 124 may comprise a polarization-preserving type or a single-mode type such as SMF-28.

Through appropriate modulation of the input current (generally for communication rates of up to 2.5 GHz) or through modulation of an external element disposed in the optical path of the output beam (not shown) (for 10 GHz and 40 GHz communication rates), data can be modulated on the output beam to produce an optical data signal. Such a signal may launched into a fiber and transmitted over a fiber-based network in accordance with practices well known in the optical communication arts, thereby providing very high bandwidth communication capabilities.

The lasing mode of an ECDL is a function of the total optical path length between the cavity ends (the cavity optical path length); that is, the optical path length encountered as the light passes through the various optical elements and spaces between those elements and the cavity ends defined by partially-reflective front facet 104 and reflective element 114. This includes diode gain chip 102, diode intracavity collimating lens 108, tuning filter elements 110, and cavity-length modulating element 112, plus the path lengths between the optical elements (i.e., the path length of the transmission medium occupying the ECDL cavity, which is typically a gas such as air). More precisely, the total optical path length is the sum of the path lengths through each optical element and the transmission medium times the coefficient of refraction for that element or medium.

As discussed above, under a lasing mode, photons pass back and forth between the cavity end reflectors at a resonance frequency, which is a function of the cavity optical path length. In fact, without the tuning filter elements, the laser would resonate at multiple frequencies. For simplicity, if we model the external laser as a Fabry-Perot cavity, these frequencies can be determined from the following equation:

$$Cl = \frac{\lambda x}{2n} \qquad (1)$$

where $\lambda$=wavelength, Cl=Length of the cavity, x=an arbitrary integer—1, 2, 3, . . . , and n=refractive index of the medium. The number of resonant frequencies is determined from the width of the gain spectrum. Furthermore, the gain spectrum is generally shaped as a parabola with a central peak—thus, the intensity of the lasing modes on the sides of the center wavelength (commonly called the side modes) rapidly drops off.

As describe below in further detail, various techniques may be applied to "tune" the laser to produce an optical output signal at a frequency corresponding to a desired communication channel. For example, this may be accomplished by adjusting one or more tuning elements, such as tuning filter elements 110, to produce a corresponding change in the cavity optical path length, thus changing the lasing mode frequency. The tuning filter elements attenuate the unwanted lasing modes such that the output beam comprises substantially-coherent light having a narrow bandwidth.

Ideally, it is desired to maximize the power of the output beam over a frequency range corresponding to the various channel frequencies the ECDL is designed for. While an obvious solution might be to simply provide more drive current, this, by itself, doesn't work because a change in the drive current changes the optical characteristics (e.g., optical path length) of the diode gain chip. Furthermore, many diode gain chips only operate over a limited range of input current.

In accordance with aspects of the invention, one technique for producing a maximal power output is to perform "wavelength locking" through phase control modulation. Under this technique, a "dither" or modulation signal is supplied to cause a corresponding modulation in the optical path length of the laser cavity. This produces a modulated phase-shift effect, resulting in a small frequency modulation of the lasing mode. The result of this frequency modulation produces a corresponding modulation of the intensity (power) of the output beam, also referred to as amplitude modulation. This amplitude modulation can be detected using various techniques. In one embodiment, the laser diode junction voltage (the voltage differential across laser diode chip 102) is monitored while supplying a constant current to the laser diode, wherein the voltage is inversely proportional to the intensity of the output beam, e.g., a minimum measured diode junction voltage corresponds to a maximum output intensity. In another embodiment, a beam splifter is employed to split off a portion of the output beam such that the intensity of the split-off portion can be measured by a photo-electric device, such as a photodiode. The intensity measured by the photodiode is proportional to the intensity of the output beam. The measured amplitude modulation may then be used to generate an error signal that is fed back into a servo control loop to adjust the (substantially) continuous optical path length of the laser so as to produce maximal intensity.

Figure 2:
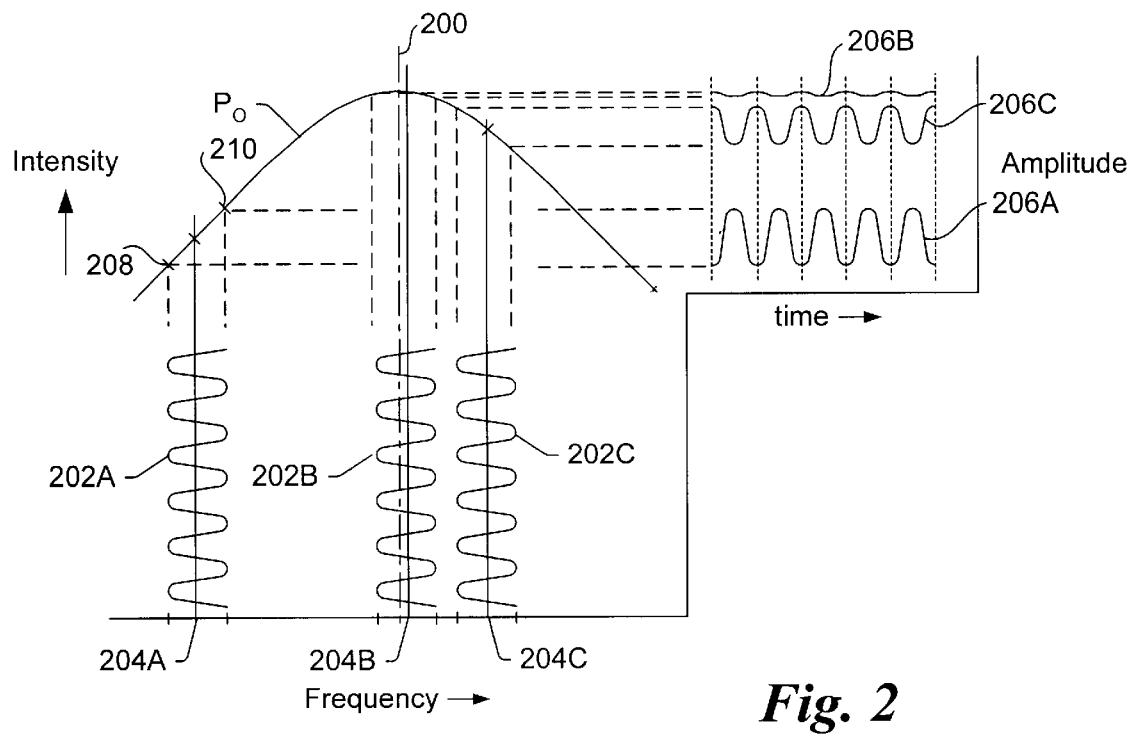
FIG. 2 is a diagram illustrating the effect modulating the optical path length of an ECDL laser cavity has on the frequency of the lasing mode and the modulation of the laser's output intensity.

The foregoing scheme is schematically illustrated in FIG. 2. The diagram shows a power output curve $P_o$ that is illustrative of a typical power output curve that results when the lasing mode is close to a desired channel, which is indicated by a channel frequency centerline 200. The objective of a servo loop that employs the phase-shift modulation scheme is to adjust one or more optical elements in the laser cavity such that lasing frequency is shifted toward the desired channel frequency. This is achieved through use of a demodulated error signal that results from frequency modulation of the lasing mode. Under the technique, a modulation signal is supplied to an optical element in the cavity, such as optical length modulation element 112, to modulate the optical path length of the cavity. This modulation is relatively small compared to the channel spacing for the laser. For example, in one embodiment the modulation may have an excursion of 4 MHz, while the channel spacing is 50 GHz.

Modulated signals 202A, 202B, and 202C respectively correspond to (average) laser frequencies 204A, 204B, and 204C. Laser frequency 204A is less than the desired channel frequency, laser frequency 204C is higher than the desired channel frequency, while 204B is near the desired channel frequency. Each modulated signal produces a respective modulation in the intensity of the output beam; these intensity modulations are respectively shown as modulated amplitude waveforms 206A, 206B, and 206C. Generally, the intensity modulations can be measured in the manners discussed above for determining the intensity of the output beam.

As depicted in FIG. 2, the peak to valley amplitude of waveforms 206A, 206B, and 206C is directly tied to the points in which the modulation limits for their corresponding frequency modulated signals 202A, 202B, and 202C intersect with power output curve $P_O$, such as depicted by intersection points 208 and 210 for modulated signal 202A. Thus, as the laser frequency gets closer to the desired channel frequency, the peak to valley amplitude of the measured intensity of the output beam decreases. At the point where the laser frequency and the channel frequency coincide, this value becomes minimized.

Figure 3:
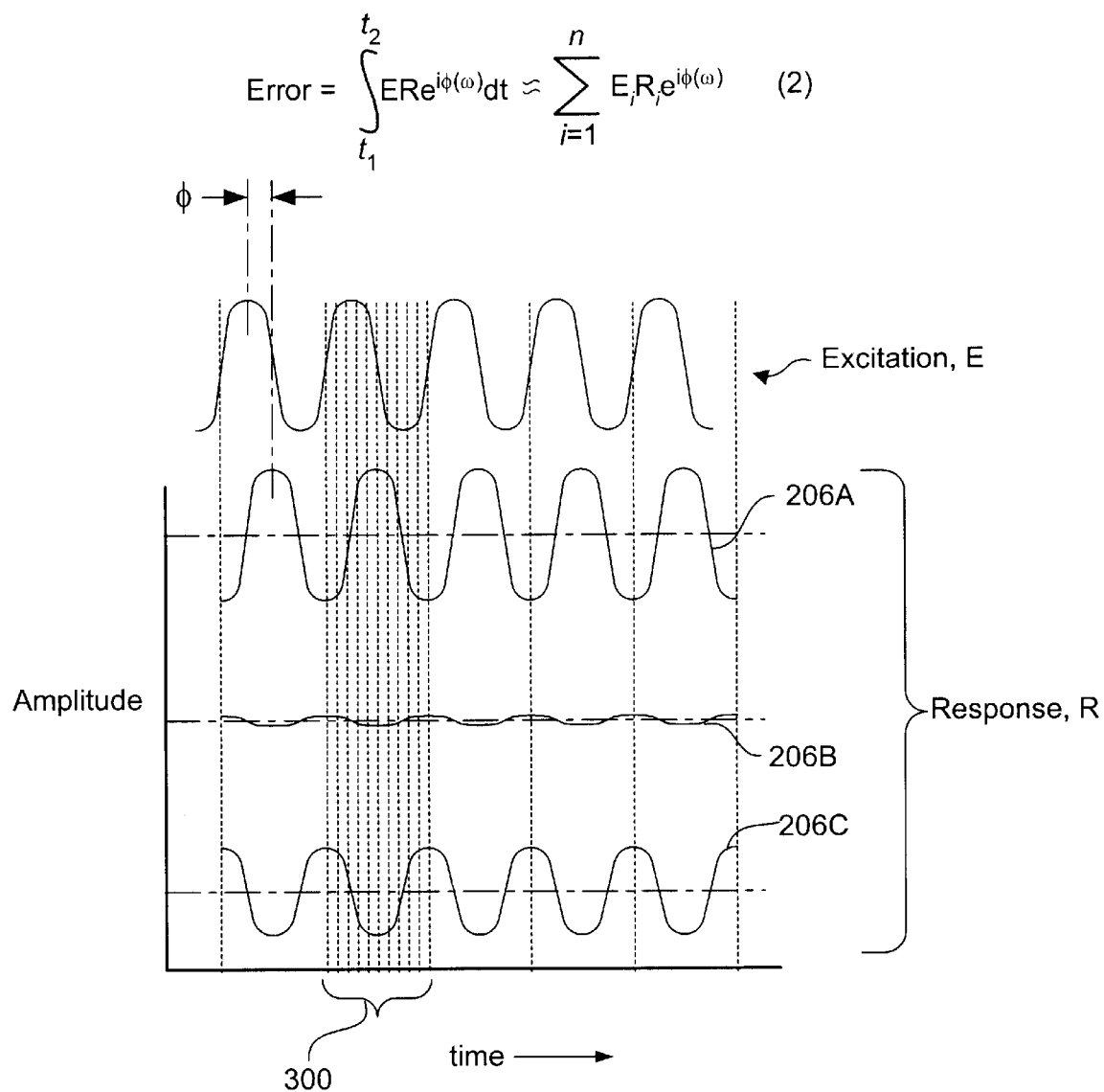
FIG. 3 is a diagram illustrating how a modulated excitation input signal and a resulting response output signal can be combined to calculate a demodulated error signal.

Furthermore, as shown in FIG. 3, the error may be derived from:

$$\text{Error} = \int_{t_1}^{t_2} ERe^{i\phi(\omega)} dt \approx \sum_{i=1}^{n} E_i R_i e^{i\phi(\omega)} \quad (2)$$

wherein the non-italicized i is the imaginary number, $\phi$ represents the phase difference between the excitation input (i.e., modulated signals 202A, 202B, and 202C) and the response output comprising the amplitude modulated output waveforms 206A, 206B, and 206C, and $\omega$ is the frequency of modulation. The integral solution can be accurately approximated boy a discreet time sampling scheme typical of digital servo loops of the type described below, as depicted by time sample marks 300.

In addition to providing an error amplitude, the foregoing scheme also provides an error direction. For example, when the laser frequency is in error on one side of the desired channel frequency (lower in the illustrated example), the excitation and response waveforms will be substantially in phase. This will produce a positive aggregated error value. In contrast, when the laser frequency is on the other side of the desired channel frequency (higher in the example), the excitation and response waveforms are substantially out of phase. As a result, the aggregated error value will be negative.

Generally, the wavelength locking frequency of modulation $\omega$ should be selected to be several orders of magnitude below the laser frequency. For example, modulation frequencies within the range of 500 Hz–100 kHz may be used in one embodiment with a laser frequency of 185–199 THz.

In accordance with other aspects of the invention, a phase modulation scheme based on similar principles to the wavelength locking technique may be deployed to suppress stimulated Brillouin scattering. SBS is a scattering of light backwards towards the transmitter caused by mechanical (acoustic) vibrations in the transmission medium (fiber). Although generally trivial in most cases, SBS can be very important in situations where a high quality, narrow linewidth laser is used at a relatively high power level.

SBS is caused by the presence of the optical signal itself. Even though a signal level of a few milliwatts seems very small, in the tiny cross-section of a single-mode fiber core the field can be very intense. An optical signal is in reality a very strong electromagnetic field. This field causes mechanical vibrations in the fibre which produce a regularly varying pattern of very slight differences in the refractive index. The Brillouin scattering effect is caused by light being reflected by the diffraction grating created by the regular pattern of RI changes.

At a more fundamental level, Brillouin scattering is understood as a scattering of a photon to a lower energy photon such that the energy difference appears in the form of a phonon. The effect is similar to Raman scattering, except that optical phonons participate in Raman scattering, whereas acoustic phonons participate in Brillouin scattering. This scattering effect results in a lost of power at the incident frequency and constitutes a loss mechanism for optical fibers.

At high power levels the nonlinear phenomena of SBS can lead to considerable fiber loss. The intensity of the scattered light grows exponentially once the incident power exceeds a threshold value. The threshold power level for SBS can be estimated by considering how the scattered-light intensity grows with noise. The SBS threshold power $P_{th}$, defined as the incident power at which half of the power is lost to SBS at the output end of a fiber of length L, can be estimated by the following equations:

$$g_B P_{th} L_{eff}/A_{eff} \approx 21, \quad (3)$$

where $g_B$ is the Brillouin gain coefficient, $A_{eff}$ is the effective mode cross section, often referred to as the effective core area, and $L_{eff}$ is the effective interaction length, defined by $$L_{eff} = [1-\exp(-\alpha L)]/\alpha. \quad (4)$$

For optical communication systems, the fiber is sufficiently long that Leff can be approximated as $1/\alpha$. If we replace $A_{eff}$ by $\pi\omega^2$, where $\omega$ is the spot size, we get:

$$P_{th} \approx 21\alpha(\pi\omega^2)/g_B. \quad (5)$$

For silica fibers, $g_B \approx 5 \times 10^{-11}$ m/W. As a result, $P_{th}$ can be as low as ~1 mW, especially near 1.55 µm, where the fiber loss is minimum. Clearly, SBS can limit the launched power considerably because of its low threshold.

The foregoing estimate of $P_{th}$ neglects the effect of spectral width associated with the incident light. Since the Brillouin-gain spectrum for silica fibers is quite narrow (<100 MHz), the threshold power can be increased to 10 mW or more by intentionally increasing the gain bandwidth (i.e., broadening the optical signal line width) to, e.g., 200–500 MHz through phase modulation.

In accordance with aspects of the invention, the line width of an optical signal produced by an ECDL is broadened by modulating the optical path length of the laser cavity so as to produce a wavelength-modulated output with a frequency excursion of sufficient bandwidth to suppress the undesired SBS effect. Under this technique, a phase modulation signal is employed at a frequency proximate to the frequency desired to minimize the back-scattered wave caused by SBS effects. Furthermore, the amplitude of the excursion of the modulated excitation signal is much higher than that used for the wavelength locking. For example, if the amplitude of the modulation signal is increased to 200–500 MHz of excursion, and the frequency range of the modulation in chosen to be in the range of 5–20 kHz, a significant level of SBS suppression may be achieved.

One might consider employing the same modulated signal for both SBS suppression and wavelength locking. While this technique can be used to support both actions, it has two disadvantages. First, this limits the option of turning off the SBS suppression, which may be desired since the SBS suppression technique may produce an undesirable level of noise in the laser's output signal. Second, the magnitude of the wavelength locking error signal changes as the SBS level is adjusted. To address the foregoing problem, techniques are now disclosed for providing concurrent wavelength locking and SBS suppression using respective modulations signals that are independently controllable. Furthermore, in one embodiment the modulations are combined to drive a single cavity length modulating element.

Figure 4:
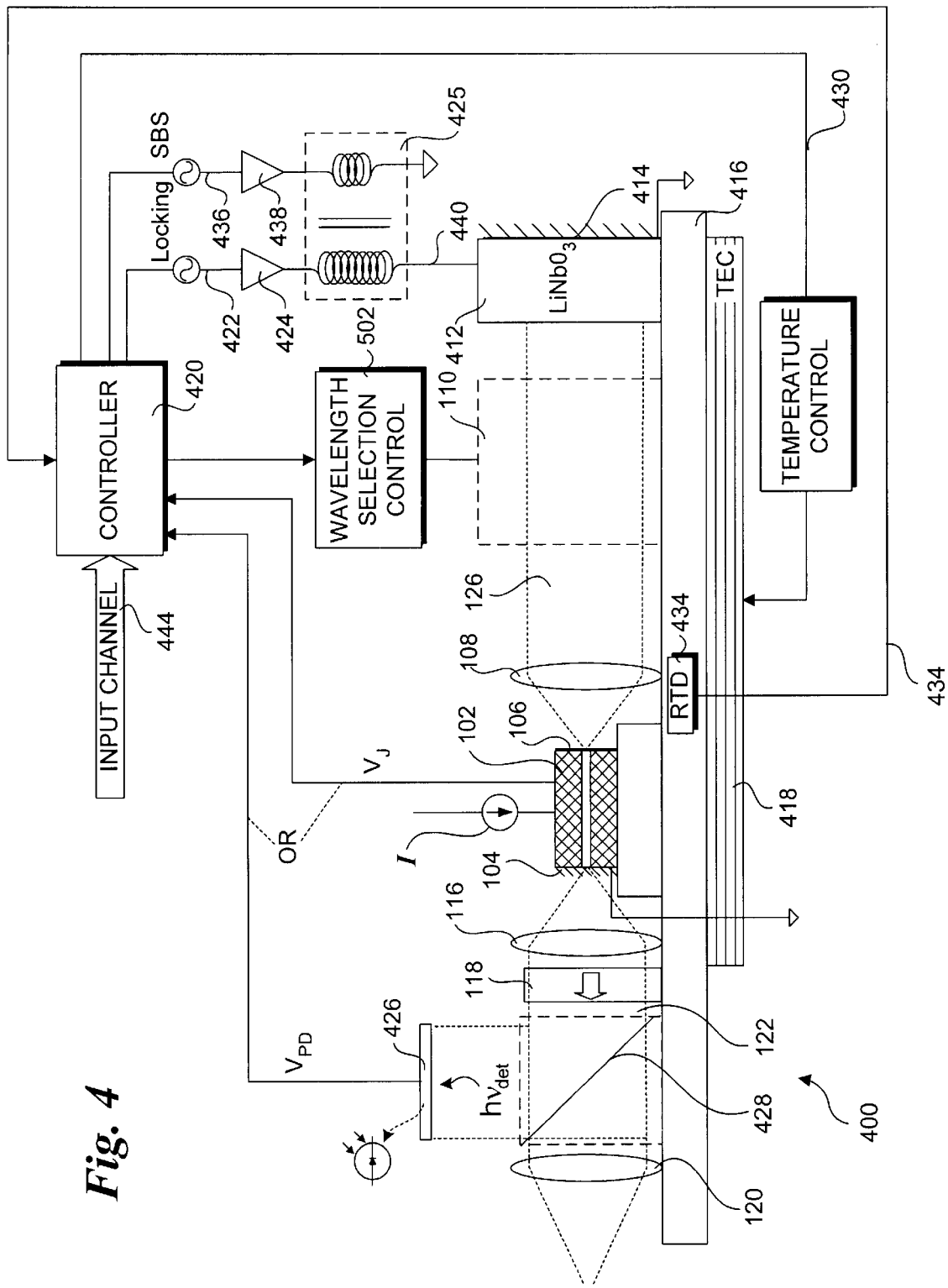
FIG. 4 is a schematic diagram of an ECDL in accordance with an embodiment of the invention in which a Lithium Niobate block is employed as an optical path length adjustment element, and wavelength locking and stimulated Brillouin scattering (SBS) suppression modulation signals are combined to drive the Lithium Niobate block to modulate the optical path length of the laser cavity.

For example, with reference to FIG. 4, an ECDL 400 in shown including various elements common to ECDL 100 having like reference numbers, such as a gain diode chip 102, lenses 108, 116, and 120, etc. ECDL 400 further includes a cavity optical path length modulating element 412 having a reflective rear face 414. More specifically, the cavity optical path length modulating element comprises a Lithium Niobate (LiNbO₃) phase modulator to which a back-side mirror is coupled. Optionally, a reflective material may be coated onto the backside of the phase modulator. Lithium Niobate is a material that changes its index of refraction (ratio of the speed of light through the material divided by the speed of light through a vacuum) when a voltage is applied across it. As a result, by providing a modulated voltage signal across the LiNbO₃ phase modulator, the optical path length of the external laser cavity can be caused to modulate, thereby producing frequency modulated signals such as signals 202A, 202B, and 202C discussed above.

The various optical components of the ECDL 400 are mounted or otherwise coupled to a thermally-controllable base or "sled" 416. In one embodiment, one or more thermal-electric cooler (TEC) elements 418, such as a Peltier element, are mounted on or integrated in sled 416 such that the temperature of the sled can be precisely controlled via an input electrical signal. Due to the expansion and contraction of a material in response to a temperature change, the length of the sled can be adjusted very precisely. Adjustment of the length results in a change in the distance between partially reflective front facet 104 and reflective element 414, which produces a change in the optical path length of the laser cavity. As a result, controlling the temperature of the sled can be used to adjust the frequency of the lasing mode. In general, temperature control of the sled will be used for very fine tuning adjustments, while coarser tuning adjustments will be made by means of tuning filter elements 110, as described in further detail below.

For simplicity, let us first consider the operation of the wavelength-locking feature alone. A controller 420 generates a modulated wavelength-locking signal 422, which is amplified by an amplifier 424. For example, in one embodiment modulated wavelength locking signal 422 comprises a 2-volt peak-to-peak signal with a frequency of about 889 Hz. The amplified modulated wavelength-locking signal then passes through the high-voltage winding side of a transformer 425. Again, for simplicity, at this point it will be assumed that there are no inductive losses through the transformer windings. The amplified modulated wavelength locking signal is then supplied to a surface of the LiNbO₃ phase modulator, while an opposite surface is connected to ground, thereby providing a voltage differential across the LiNbO₃ material. As a result, the optical path length of the modulator, and thus the entire laser cavity, is modulated at the modulation frequency (e.g. 889 Hz). In one embodiment, the 2-volt peak-to-peak voltage differential results in a frequency excursion of approximately 4 MHz.

This path length modulation produces a modulation in the intensity of output beam 122, which in one embodiment is detected by a photodetector 426. As depicted in FIG. 4, a beam splitter 428 is disposed in the optical path of output beam 122, causing a portion of the output beam light to be directed toward photodetector 426. In one embodiment, photodetector 426 comprises a photo diode, which generates a voltage charge in response to the light intensity it receives ($hv_{det}$). A corresponding voltage VPD is then fed back to controller 420.

Controller 420 includes a digital servo loop (e.g., phase lock loop) that is configured to adjust the temperature of sled 416 such that the amplitude modulation of the light intensity detected a photodectector 426 is minimized, in accordance with the frequency modulation scheme discussed above with reference to FIGS. 2 and 3. In an optional embodiment, the junction voltage across gain diode chip ($V_J$) is employed as the intensity feedback signal, rather than $V_{PD}$. An error signal is then derived by based on the amplitude modulation and phase of $V_{PD}$ m or $V_J$ in combination with modulated wavelength locking signal 422. In response to the error signal, an appropriate adjustment in temperature control signal 430 is generated. Adjustment of the sled temperature causes a corresponding change in the overall cavity length, and thus the lasing frequency. This in turn results in (ideally) a decrease in the difference between the lasing frequency and the desired channel frequency, thus completing the control loop. To reach an initial condition, or for a second feedback signal, a resistive thermal device (RDT) 432, such as a thermister or thermocouple, may be used to provide a temperature feedback signal 434 to controller 420.

Now let's consider the concurrent SBS suppression feature. Controller 420 generates an SBS suppression signal 436, which is amplified by an amplifier 438. The voltage of the amplified SBS suppression signal is then multiplied and coupled into a composite phase modulation drive signal 440 by means of transformer 425, which functions as both a multiplier and adder block. For example, in one embodiment the winding ratio of transformer 412 is in the range of 90–130:1. Using a 90:1 winding ratio, and SBS suppression signal 436 having a 2-volt peak-to-peak amplitude at 20 KHz, the resultant voltage passing out of transformer 425 is approximately 180 volts peak-to-peak at 20 KHz. In one embodiment, when this peak-to-peak voltage level is input into $LiNbO_3$ phase modulator, a frequency modulation having an excursion of approximately 400 MHz and a modulation frequency of 20 KHz is produced. Such a frequency modulation has been shown to provide good SBS suppression.

As would be expected, the modulated frequency resulting from the SBS suppression portion of the $LiNbO_3$ phase modulator drive signal produces a corresponding amplitude modulation in the output beam intensity, which is detected by photodetector 426 or at the diode junction voltage. In fact, the resultant intensity amplitude modulation due to the SBS suppression signal is significantly greater than the intensity amplitude modulation caused by the wavelength locking frequency modulation. Normally, this would cause an adverse effect on the wavelength locking servo loop. However, as described below, a band-pass filtering scheme is employed to substantially attenuate the portion of the voltage feedback signal due to the SBS suppression modulation.

In addition to wavelength locking and SBS suppression, ECDL 400 also provides channel-tuning features. As illustrated, controller 420, in combination with a wavelength selection control block 442 and tuning filter elements 110, is used to switch the lasing frequency to correspond to a desired communication channel. For example, in response to an input channel command 446, controller 420 sends a corresponding frequency command signal to wavelength selection control block 442, which then provides a control input to tuning filter elements 110 to cause the lasing mode to be switched proximate to the desired input channel frequency. A continuous fine tuning adjustment is then made by means of the wavelength locking servo loop.

Figure 5:
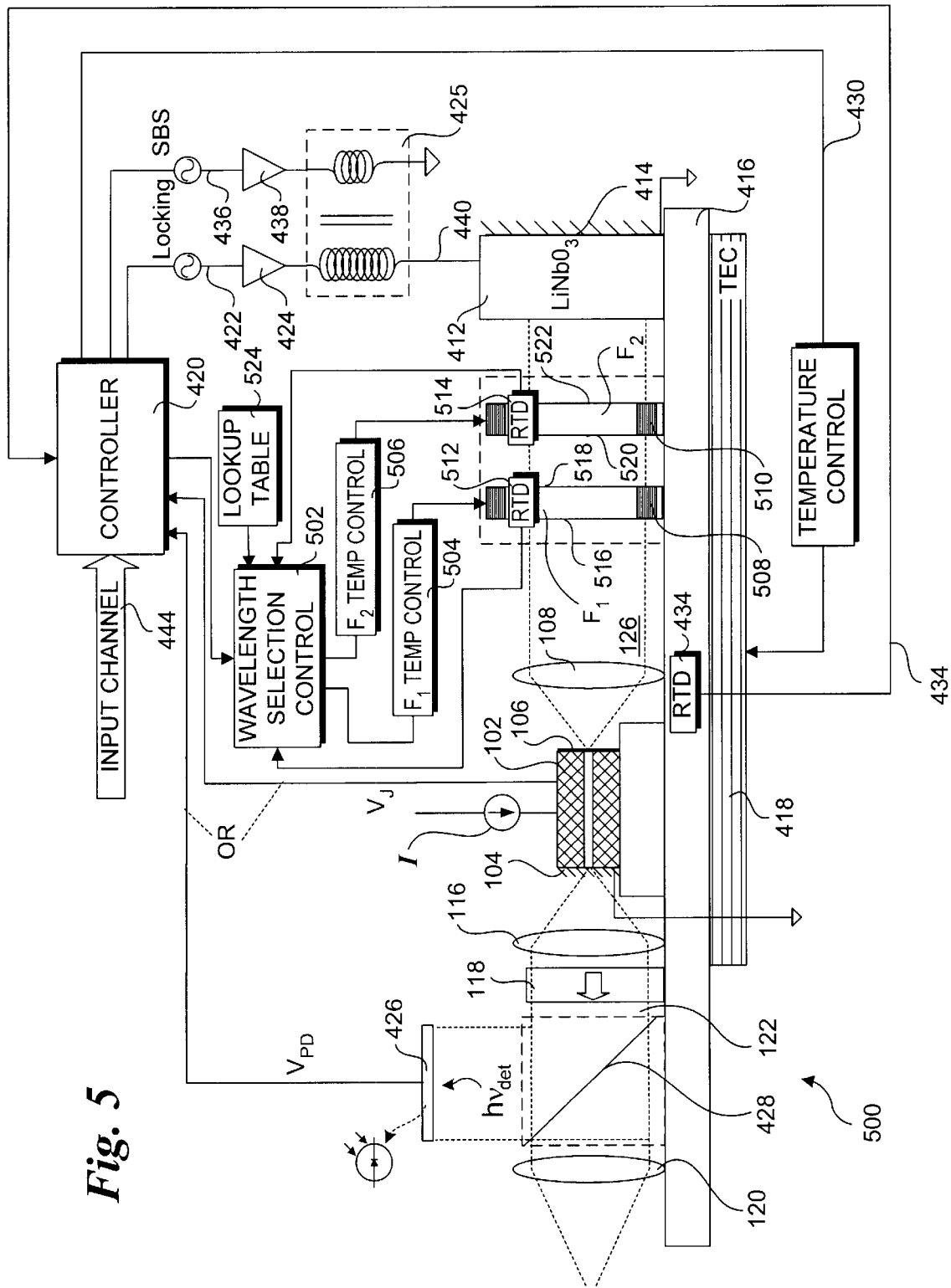
FIG. 5 is a schematic diagram showing further details of the channel selection control aspects of the ECDL of FIG. 4 in accordance with one embodiment of the invention.

In general, any of various tuning filter elements and corresponding tuning adjustment techniques may be employed for channel selection purposes. For example, in an ECDL 500 shown in FIG. 5, tuning filter elements 110 comprise first and second tunable filters $F_1$ and $F_2$. In one embodiment, filters $F_1$ and $F_2$ comprise respective etalons, either made of a solid material or being gas filled. In one embodiment, filter tuning is effectuated by changing the optical path length of each etalon. This in turn may be induced by changing the temperature of the etalons.

For example, ECDL 500 now shows further details of an channel selection subsystem including a wavelength selection control block 502. It is noted that although the wavelength selection control block is shown external to controller 420, the control aspects of this block may be provided by the controller alone. Wavelength selection control block 502 provides electrical outputs 504 and 506 for controlling the temperatures of filters $F_1$ and $F_2$, respectively. In one embodiment, temperature control element is disposed around the perimeter of a circular etalon, as depicted by TECs 508 and 510. Respective RTDs 512 and 514 are employed to provide a temperature feedback signal back to wavelength selection control block 502.

Generally, etalons are employed in laser cavities to provide filtering functions. They function as Fabry-Perot resonators. The result of passing an optical beam through an etalon produces a set of transmission peaks (also called passbands) in the laser output. The spacing of the transmission peaks (in frequency, also known as the free spectral range) is dependent on the distance between the two faces of the etalon, e.g., faces 516 and 518 for filter $F_1$, and faces 520 and 522 for filter $F_2$. As the temperatures of the etalons change, the etalon material is caused to expand or contract, thus causing the distance between the faces to change. This effectively changes the optical path length of the etalons, which may be employed to shift the transmission peaks.

The effect of the filters is cumulative. As a result, all lasing modes except for a selected channel lasing mode can be substantially attenuated by lining up a single transmission peak of each filter. In one embodiment, the configurations of the two etalons are selected such that the respective free spectral ranges of the etalons are slightly different. This enables transmission peaks to be aligned under a Vernier tuning technique similar to that employed by a Vernier scale. In one embodiment, one of the filters, known as a "grid generator," is configured to have a free spectral range corresponding to a communications channel grid, such as the ITU wavelength grid, and the peaks are aligned with ITU channel frequencies. This wavelength grid remains substantially fixed by maintaining the temperature of the corresponding grid generator etalon at a predetermined temperature. At the same time, the temperature of the other etalon, known as the channel selector, is adjusted so as to shift its transmission peaks relative to the those of the grid generator. By shifting the transmission peaks of the filters in this manner, transmission peaks corresponding to channel frequencies may be aligned, thereby producing a cavity lasing mode corresponding to the selected channel frequency. In another embodiment, the transmission peaks of both the filters are shifted to select a channel.

Generally, either of these schemes may be implemented by using a channel-etalon filter temperature lookup table in which etalon temperatures for corresponding channels are stored, as depicted by lookup table 524. Typically, the etalon temperature/channel values in the lookup table may typically be obtained through a calibration procedure, through statistical data, or calculated based on tuning functions fit to the tuning data. In response to an input channel selection 444, the corresponding etalon temperatures are retrieved from lookup table 524 and employed as target temperatures for the etalons using appropriate temperature control loops, which are well-known in the art.

In accordance with another aspect of the invention, embodiments are provided for modulating the laser cavity optical path length by modulating the distance between the cavity's reflective ends, i.e., modulating the physical length of the cavity. In this instance, the physical cavity length modulation produces a corresponding optical path length modulation, resulting in an intensity-modulation in the laser output in a manner similar to the Lithium Niobate embodiment discussed above.

Figure 6:
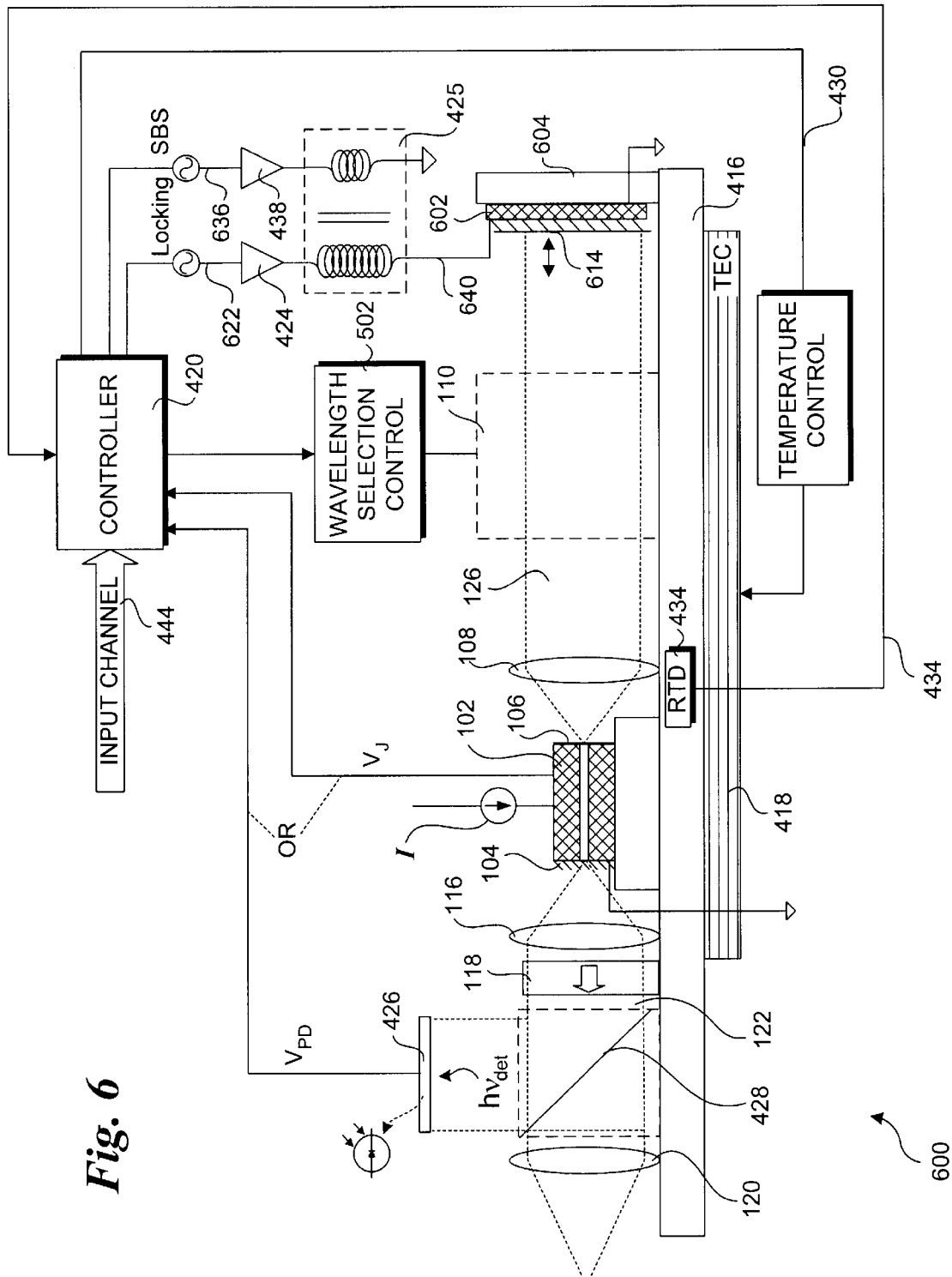
FIG. 6 is a schematic diagram of an ECDL in accordance with an embodiment of the invention in which a piezo-electric element is employed as an optical path length adjustment element, whereby the physical length of the laser cavity is modulated to induce an intensity modulation in the laser's output.

An ECDL 600 illustrative of a first embodiment for modulating the physical length of the cavity is shown in FIG. 6. This embodiment employs a piezoelectric element 602, having a backside face mounted to an upright member 604, which in turn is coupled to base 416. A reflective element (e.g. mirror) 614 is mounted to or formed on the frontside face of piezoelectric element 602. For example, reflective element may comprise a reflective coating applied to the frontside face of the piezoelectric element.

In response to a voltage differential across its faces, the piezoelectric element 602 is caused to expand and contract. If the amplitude of the voltage is modulated, the expansion and contraction of the piezoelectric element will be modulated as well, effectively modulating the thickness of the element. Since reflective element 606 is mounted to or formed on the frontside face of piezoelectric element 602, the physical cavity length is caused to modulate in response to the piezoelectric element modulation, including an intensity modulation in the laser's output, as desired.

In a manner similar to that discussed above, a wavelength locking signal 622 and an SBS suppression signal 636 are generated by controller 420. These signals are then amplified by respective amplifiers 424 and 438, and then combined by transformer 425. As before, the amplitude of the SBS suppression signal is also amplified via the transformer windings ratio. The result is a composite drive signal 640, which is used to drive the modulation of piezoelectric element 602.

Figure 7:
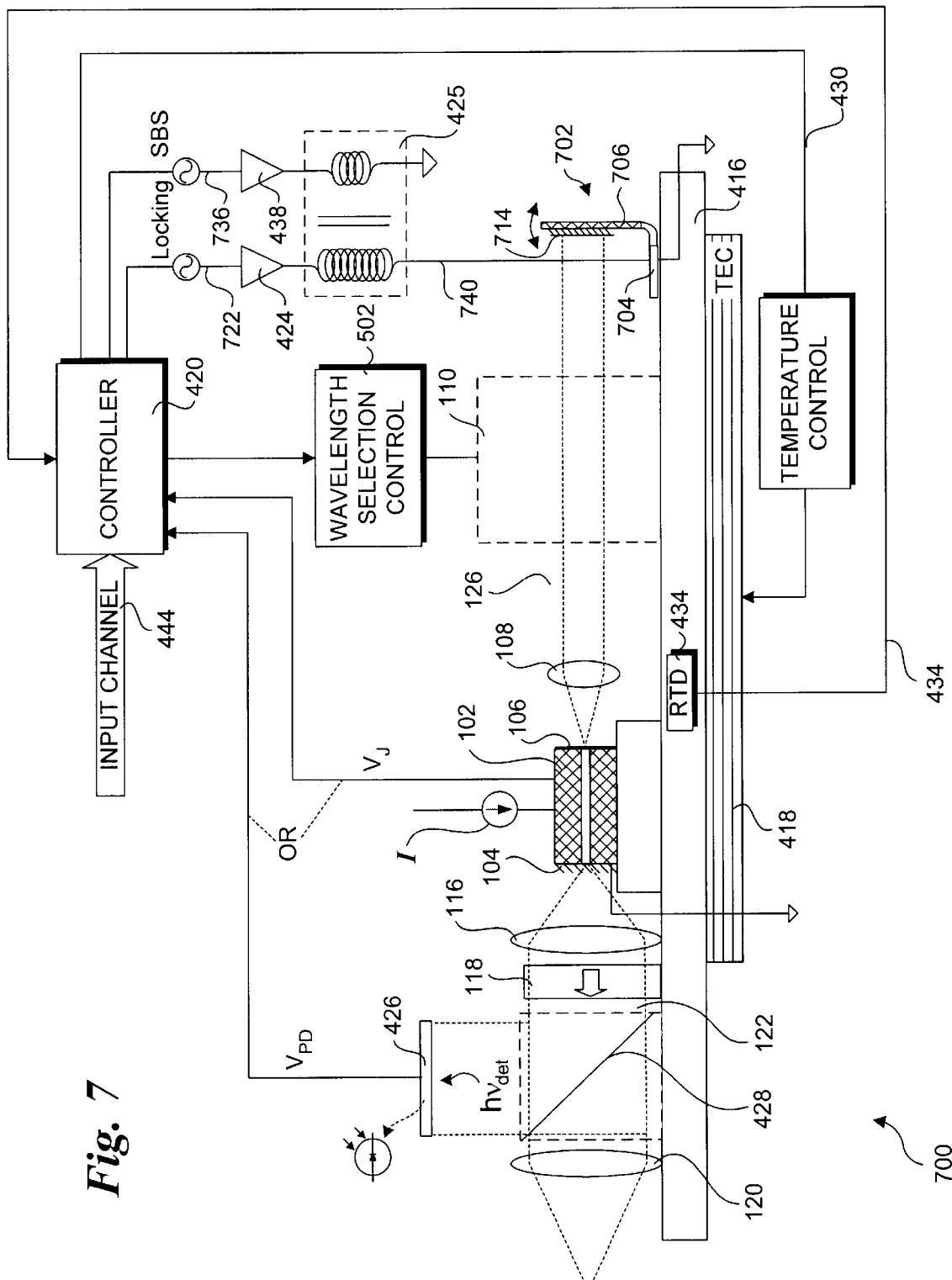
FIG. 7 is a schematic diagram of an ECDL in accordance with an embodiment of the invention in which a MEMS-actuated mirror is employed as an optical path length adjustment element, whereby the physical length of the laser cavity is modulated to induce an intensity modulation in the laser's output.

An ECDL 700 illustrating a second embodiment for modulating the physical cavity path length is shown in FIG. 7. In this embodiment a MEMS (Micro-Electro-Mechanical Systems) device 702 is employed. In the illustrated embodiment, MEMS device 702 comprises a MEMS hinge including an actuator 704 coupled to a cantilevered plate 706. A portion of the frontside face of the cantilevered plate is coated with a reflective surface 714. In one embodiment, actuator 704 comprises a pair of "comb" arrays, wherein the fixed fingers of one of the comb arrays are coupled to base 416, while the free fingers of the other comb array are coupled to cantilevered plate 706. In response to an electrical input, and electrostatic force is generated, causing the free comb fingers to move relative to the fixed fingers. As a result, the hinge is rotated, thereby shortening and lengthening the physical laser cavity length. Generally, the amount of rotation is very small, producing a length modulation in one embodiment of approximately 1 or 2 nm.

MEMS comb array actuators of the foregoing type are known in the MEMS arts. In addition to hinge-type actuators, parallel displacement actuators may be used as well, such as an electrostatically actuated parallel plate configuration employing quadrilateral flexures. When a parallel displacement actuator is employed, it will be mounted to an upright member and employed in a manner similar to piezoelectric element 602.

The drive signals for MEMS actuator 702 are similar to those used above for the piezoelectric element. These signals include wavelength locking and SBS suppression signals 722, and 736, which are combined via transformer 425 into a composite drive signal 740.

Figure 8:
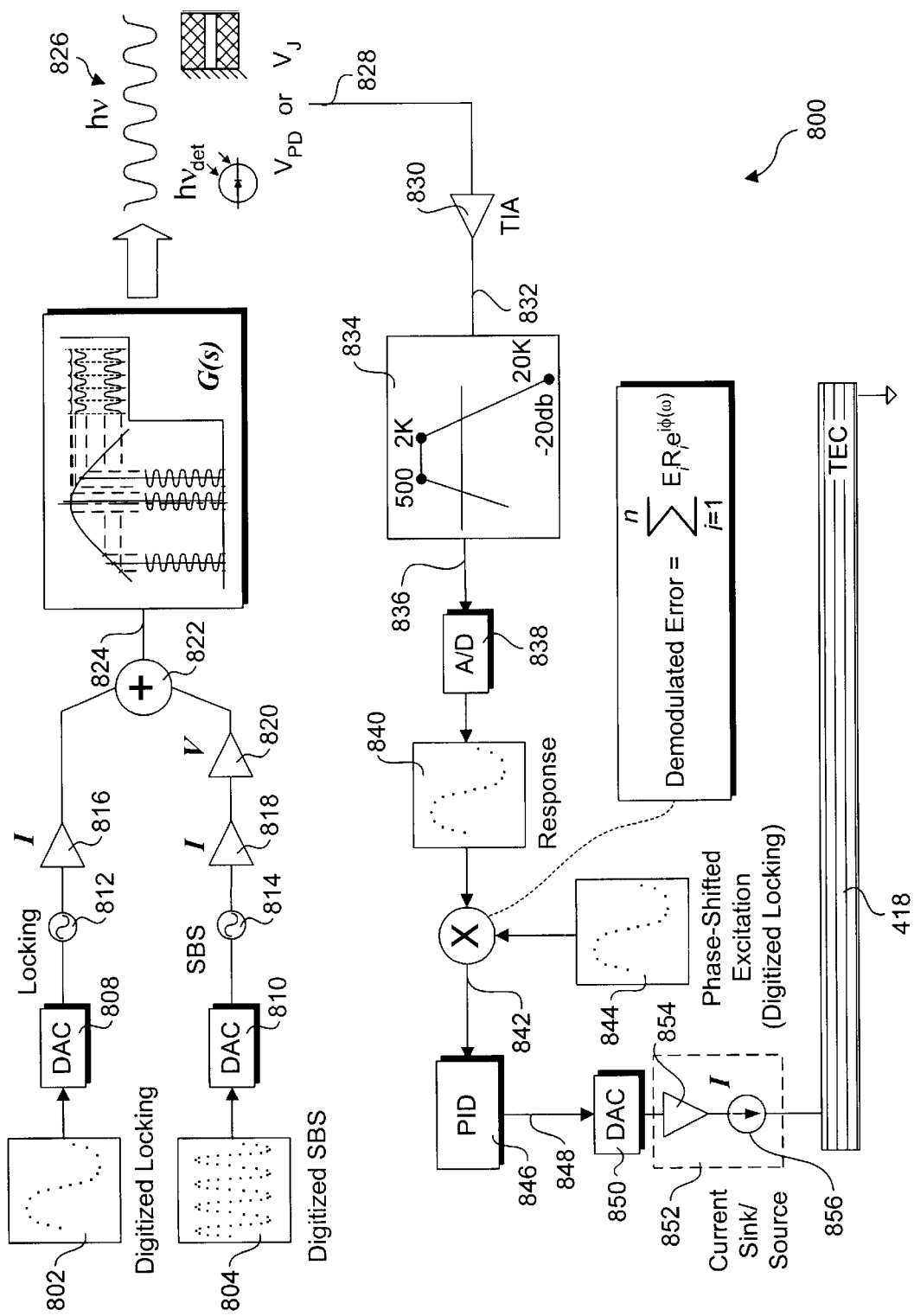
FIG. 8 is a schematic diagram of a digital servo control system for concurrently performing wavelength locking and generating an SBS suppression modulation in the output of the laser.

An servo control block diagram 800 corresponding to control operations performed by controller 420 and related components in accordance with one embodiment of the invention is shown in FIG. 8. The servo loop employs a digital sampling scheme common to many digital control systems. In one embodiment, the sampling frequency is 100 Hz. A signal indicating the start of each sampling period is provided by a clock/counter 806. During each sampling period, respective values from a digitized wavelength locking waveform 802 and a digitized SBS suppression waveform 804 are retrieved. Generally, digitized waveforms 802 and 804 may be stored in a lookup table containing a drive signal value column and a cycle count column.

The wavelength locking and SBS suppression drive signal values are retrieved from the respective lookup tables and provided as inputs to respective digital-to-analog converters (DACs) 808 and 810. When a digitized waveform is fed into a DAC at a fixed rate (i.e., sampling frequency), the DAC will output a smoothed analog waveform corresponding to the input digital waveform. These analog waveforms are depicted as analog waveforms 812 and 814.

Next, analog waveforms 812 and 814 are fed into respective amplifiers 816 and 818. These amplifiers amplify the current of the drive signals. The SBS suppressions signal is then amplified in voltage, as depicted by an amplifier 820, and the two signals are combined at a combiner block 822. As discussed above, in one embodiment both the amplification of the SBS suppression signal and the combining of the signals are performed by transformer 425. This produces a composite drive signal 824, which is supplied to one of the optical path length adjustment elements discussed above to cause a modulation in the laser cavity optical path length, resulting in a modulation in the intensity of the output of the laser. This corresponds to a transfer function G(s) of the laser, with the resulting intensity modulation shown at 826.

Next, an intensity modulation feedback signal 828 is generated. As described above, this feedback signal may comprise a signal derived from direct measurement of the intensity modulation using a photo-electric sensor or the like (as depicted by $V_{PD}$), or may be obtained by measuring the laser diode junction voltage $V_J$, which is indicative of the intensity modulation. The intensity modulation feedback signal is the amplified by a trans-impedance amplifier (TIA) 830, producing an amplified intensity modulation feedback signal 832.

At this point, the amplified intensity modulation signal comprises a composite signal formed by superimposing the intensity modulation due to the wavelength locking optical path length modulation. and the intensity modulation due to the SBS suppression path length modulation. This latter intensity modulation is substantially greater in amplitude than the former.

In order to perform wavelength locking, the portion of the intensity modulation feedback signal pertaining to the wavelength locking modulation needs to be separated out from the composite signal. This is accomplished by a bandpass filter 834. The bandpass filter allows signals (or portions of a composite signal) having a frequency range within the bandpass to pass through substantially unattenuated, while attenuating signals (or portions of a composite signal) having a frequency above or below the bandpass frequency range. In the embodiment discussed above, the wavelength locking modulation signal has a frequency of 889 Hz, while the SBS suppression modulation signal has a frequency of 20 KHz. In the bandpass filter depicted, the nominal bandpass range is 500 Hz to 2000 Hz, with a dropoff rate selected such that signals at 20 KHz are attenuated approximately 20 db.

Thus, after passing through bandpass filter 834, a feedback signal 836 is produced reflecting the wavelength locking portion of the intensity modulation with the portion of the intensity modulation due to SBS suppression modulation removed. This feedback signal is then fed into an analog-to-digital converter (A/D) 838, which converts the signal into a digital value, illustrated by a digitized response waveform 840.

Next, a demodulated error signal 842 is produced. As discussed above, the demodulated error signal can be derived by the dot product of the response waveform times the excitation waveform in accordance with the summation formula of equation 2. This will generally be a function of the phase shift angle ϕ between the excitation signal input and the resulting response signal output. It is advantageous to eliminate this phase shift angle, as it may lead to inconsistent error signals. In one embodiment, this is performed by digitally shifting the excitation by an amount substantially equal to the phase shift, as depicted by phase-shifted excitation signal 844. Generally, the amount of phase shift, which represents a time delay, can be numerically calculated or empirically derived (most common). In general, the primary components of the phase shift are due to the amplifiers, filters, transformer, and electromechanical elements.

The demodulated error signal is then provided as an input to a PID (proportional, integral and derivative) control block 846, which is well known in the control system art. The PID block outputs a digital temperature command signal 848, which is converted into an analog form by DAC 850. The signal is then feed into a current control block 852, depicted by an amplifier 854 and a current sink/source 856. This current sink/source is used to control the direction of the current passing through TEC 418. In accordance with Peltier device principles, if a current is driven one way, the device functions as a heating element, while reversing the current causes the device to act as a cooling element. Thus TEC 418 can be used to adjust the temperature of base 416 very rapidly.

In addition to providing fine tuning of the (substantially) continuous optical path length of the laser cavity by adjusting the temperature of the laser's base, other techniques that produce similar results may be employed. For example, in one embodiment the temperature of the gain medium is controlled, as described in co-pending application Ser. No. 10/335,775, entitled "LASER FACET PHASE CONTROL," filed concurrently herewith. Other techniques to control the path length of the laser cavity can be employed, such as use of the piezoelectric actuator or MEMS mirror that apply the dither discussed above and shown in FIGS. 6 and 7, or via a control current to the laser diode such as via a tuning or phase control section. For example, the gain medium chip may include a phase control section with two regions where current is injected—one controls the gain as usual, but the other passes through a similar section where the material has been changed so that no gain is produced but just the index is changed—hence producing a corresponding change in the optical path length of the cavity.

In one embodiment, the various ECDL configurations described herein may be manufactured using a hybrid process, combining semiconductor-type processing techniques for forming applicable elements on a substrate, and then attaching other components to the substrate during subsequent operations. For example, in one embodiment, base 416 comprises an aluminum nitride substrate. The laser gain chip element 102 and its submount are mounted onto this substrate, as are the other elements of the ECDL. The mounting techniques generally include soldering, laser welding, and epoxy attachments.

It is noted that although the foregoing embodiment provide concurrent wavelength locking and SBS suppression, this is not required during laser operation. For example, under some circumstances it may be desired to disable SBS suppression. This can be accomplished by simply disabling the SBS suppression drive signal via an appropriate command to the controller. The separation of wavelength locking and SBS suppression signals also enables their parameters (e.g., frequency and amplitude) to be independently adjusted.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method comprising:
   generating a first excitation signal comprising a wavelength locking signal to lock the wavelength of a laser output to a selected channel;
   inducing, in a laser, a first laser cavity optical path length modulation in response to the first excitation signal, said first laser cavity optical path length modulation producing first wavelength and intensity modulations of the laser output about a first frequency;
   generating a second excitation signal comprising a stimulated Brillouin Scattering (SBS) suppression signal; and
   concurrently inducing a second laser cavity optical path length modulation in response to the second excitation signal, said second laser cavity optical path length modulation producing second wavelength and intensity modulations of the laser output about a second frequency to suppress SBS scattering.

2. The method of claim 1, wherein the first and second laser cavity optical path length modulations are induced by providing a combined excitation signal derived from the first and second excitation signals to drive a common optical path length adjustment element.

3. The method of claim 2, wherein the common optical path length adjustment element comprises an optical element disposed in the laser cavity that changes it optical path length in response to the combined excitation signal.

4. The method of claim 3, wherein the common optical path length adjustment element comprises an optical element that changes its index of refraction in response to an electrical input.

5. The method of claim 2, wherein the first and second excitation signals are combined using a transformer.

6. The method of claim 5, further comprising amplifying a voltage amplitude of one of the first or second excitation signals via the transformer.

7. The method of claim 1, further comprising:
   detecting the first and second intensity modulations of the laser output to produce a composite intensity modulation feedback signal;
   filtering out a substantial portion of the composite intensity modulation feedback signal pertaining to the portion of the composite signal due to SBS suppression to produced a filtered feedback signal; and
   employing the filtered feedback signal to tune the laser.

8. The method of claim 7, wherein the intensity modulations of the laser output are detected using a photo-electric sensor.

9. The method of claim 7, wherein the intensity modulations of the laser output are detected by monitoring a change in an electrical characteristic of a gain medium employed by the laser.

10. The method of claim 7, wherein the laser is tuned by adjusting an overall length of the laser cavity.

11. A laser comprising:

a base;

a gain medium operatively coupled to the base, having front and rear facets, to produce an optical emission in response to an electrical input;

a reflective element, operatively coupled to the base, to form a laser cavity having endpoints defined by the front facet of the gain medium and a face of the reflective element;

an optical path length adjustment element operatively coupled to the base; and a controller to generate an electrical input comprising first and second excitation signals to the optical path length adjustment element to produce first and second modulations of the overall optical path length of the laser cavity, which induce respective first and second wavelength and intensity modulations in an output of the laser about respective first and second frequencies, the first wavelength and intensity modulation to produce a wavelength locking feedback signal employed by the controller to lock the laser output to a selected channel, the second wavelength and intensity modulation to suppress stimulated Brillouin scattering.

12. The laser of claim 11, further comprising:

a detector, to produce an output signal corresponding to the first and second intensity modulations in the laser output; and a filter, to receive the detector output signal as an input and substantially filter out the second intensity modulation to produce a filtered output signal that is received as a tuning feedback input signal by the controller.

13. The apparatus of claim 12, further comprising:

at least one thermoelectric element, thermally coupled to the base; and a tuning servo mechanism provided by the controller that provides fine tuning adjustment to a frequency of the laser output by adjusting the temperature of the base via an electrical input to said at least one thermoelectric element.

14. The laser of claim 12, wherein the detector comprises a photo-electric sensor, and the laser further includes a beam splitter disposed in an optical path of the output of the laser to split off a portion of the output and direct the split-off portion toward the photo-electric sensor.

15. The laser of claim 12, wherein the gain medium comprises a diode laser, and the detector comprises a voltage detector that detects a voltage difference across a diode junction of the laser diode.

16. The laser of claim 11, wherein the optical path length adjustment element comprises an optical element disposed in the laser cavity made of a material that changes its index of refraction in response to an electrical input.

17. The laser of claim 16, wherein the reflective element is coupled to a rear face of the optical path length adjustment element.

18. The laser of claim 11, wherein the optical path length adjustment element comprises a piezoelectric element operatively coupled to the reflective element.

19. The laser of claim 11, wherein the optical path length adjustment element comprises a Micro-Electro-Mechanical Systems (MEMS) element coupled to the base and the reflective element and responsive to an electric input to cause a displacement in the location of the reflective element.

20. The laser of claim 11, wherein the controller generates respective first and second excitation signals to induce the first and second modulations in the overall optical path length of the laser cavity, said first and second excitation signals being independently controllable.

21. The laser of claim 11, wherein the gain medium includes a gain section and a phase control section via which a change in the optical path length of the gain medium may be adjusted in response to an electrical input, said phase control section comprising the optical path length adjustment element.

22. The laser of claim 11, wherein the controller generates respective first and second excitation signals to induce the first and second modulations in the overall optical path length of the laser cavity, further comprising a signal combiner to receive the first and second excitation signals as in input and output a combined excitation signal that is used to drive the optical path length adjustment element.

23. The laser of claim 22, wherein the combiner comprises a transformer.

24. The laser of claim 23, wherein the transformer is further employed to amplify the second excitation signal.

25. A laser comprising:

a gain medium to generate an optical emission;

first and second reflective elements, defining a laser cavity;

first means for adjusting an overall optical path length of the laser cavity; and control means for generating a drive signal to the means for adjusting the overall optical path length of the laser cavity to cause first and second modulations in the overall optical path length of the laser cavity to induce first and second wavelength and intensity modulations in an output of the laser about respective first and second frequencies, the first wavelenght and intensity modulation to produce a wavelength locking feedback signal employed by the controller to lock the laser output to a selected channel, the second wavelength and intensity modulation to suppress stimulated Brillouin scattering.

26. The laser of claim 25, wherein the second intensity modulation has an amplitude at least one order of magnitude greater than the first intensity modulation.

27. The laser of claim 25, further comprising second means for adjusting the overall optical path length of the laser cavity, said second means employed for fine tuning an output frequency of the laser output in response to a feedback signal derived from the first intensity modulation.

28. The laser of claim 27, further comprising:

detection means for providing a feedback signal indicative of the first and second intensity modulations; and filtering means for filtering the feedback signal such that the second intensity modulation portion of the feedback signal is substantially attenuated.

29. The laser of claim 25, wherein the second intensity modulation is about a frequency selected to suppress stimulated Brillouin scattering in an optical fiber.

* * * * *

UNITED STATES PATENT AND TRADEMARK OFFICE
CERTIFICATE OF CORRECTION

PATENT NO. : 6,661,815 B1  Page 1 of 1
DATED : December 9, 2003
INVENTOR(S) : Kozlovsky et al.

It is certified that error appears in the above-identified patent and that said Letters Patent is hereby corrected as shown below:

<u>Column 6,</u>
Line 12, delete "boy", insert -- by --.

Signed and Sealed this

Sixth Day of April, 2004

JON W. DUDAS
*Acting Director of the United States Patent and Trademark Office*